United States Patent [19]

Boothroyd et al.

[11] Patent Number: 5,251,321
[45] Date of Patent: Oct. 5, 1993

[54] BINARY TO BINARY CODED DECIMAL AND BINARY CODED DECIMAL TO BINARY CONVERSION IN A VLSI CENTRAL PROCESSING UNIT

[75] Inventors: Donald C. Boothroyd, Phoenix; Clinton B. Eckard; Ronald E. Lange, both of Glendale; William A. Shelly, Phoenix; Ronald W. Yoder, Mesa, all of Ariz.

[73] Assignee: Bull HN Information Systems Inc., Phoenix, Ariz.

[21] Appl. No.: 954,437

[22] Filed: Sep. 30, 1992

Related U.S. Application Data

[63] Continuation of Ser. No. 541,229, Jun. 20, 1990.

[51] Int. Cl.⁵ .............................................. G06F 5/06
[52] U.S. Cl. ............................ 395/775; 364/DIG. 1; 364/232.8; 364/260.4; 364/715.03; 341/84; 341/85
[58] Field of Search ............................ 341/83, 84, 85; 395/775, 800; 364/200, DIG. 1, 900, 715.03

[56] References Cited

U.S. PATENT DOCUMENTS

| | | | |
|---|---|---|---|
| 4,016,560 | 4/1977 | Fowler | 341/84 |
| 4,121,284 | 10/1978 | Hyatt | 341/24 |
| 4,277,827 | 7/1981 | Carlson et al. | 395/500 |
| 4,292,666 | 9/1981 | Hill et al. | 364/147 |
| 4,442,504 | 4/1984 | Dummermuth et al. | 395/725 |
| 4,467,414 | 8/1984 | Aragi et al. | 395/250 |
| 4,638,300 | 1/1987 | Miller | 341/84 |
| 4,849,979 | 6/1989 | Maccianti et al. | 371/68 |
| 4,916,696 | 10/1990 | Funanubo | 371/11.3 |

OTHER PUBLICATIONS

Motorola, "MC 68020 32-bit Microprocessor Users Manual", Second Edition, 1984; pp. 1-2, 1-3, 3-6, 4-6.
Intel Corporation, "Microprocessors, vol. I", p. 2-1, 1992.

*Primary Examiner*—Dale M. Shaw
*Assistant Examiner*—Lance L. Barry
*Attorney, Agent, or Firm*—J. Solakian; J. Phillips

[57] ABSTRACT

Binary-Coded-Decimal to binary (DTB) and binary to Binary Coded Decimal (BTD) instructions are executed by an address and execution (AX) chip, a decimal numeric (DN) chip, and a cache. For a DTB instruction, the DN chip receives the operand to be converted from the cache, saves the sign, and stores it in a conversion register. When a bit is converted, a Ready-to-Send signal is sent on a COMFROM bus with a Ready-to-Receive Command on a COMTO bus causes the AX chip to accept the bit and the DN chip to generate the next bit until the resultant operand is produced. If the operand to be converted is negative, the DN chip inverts each remaining bit after the first "1" to obtain a two's-complement result. The result in either case is sent to the cache. For a BTD instruction, the AX chip receives the operand to be converted from the cache, send the sign bit to the DN chip and then the bits of the operand when the Ready-to-Send and Ready to Ready-to-Receive signals are produced. The resultant operand is sent to the conversion register. If the operand is negative, all bits are inverted, and a one is added to produce the resultant in two's complement notation.

4 Claims, 5 Drawing Sheets

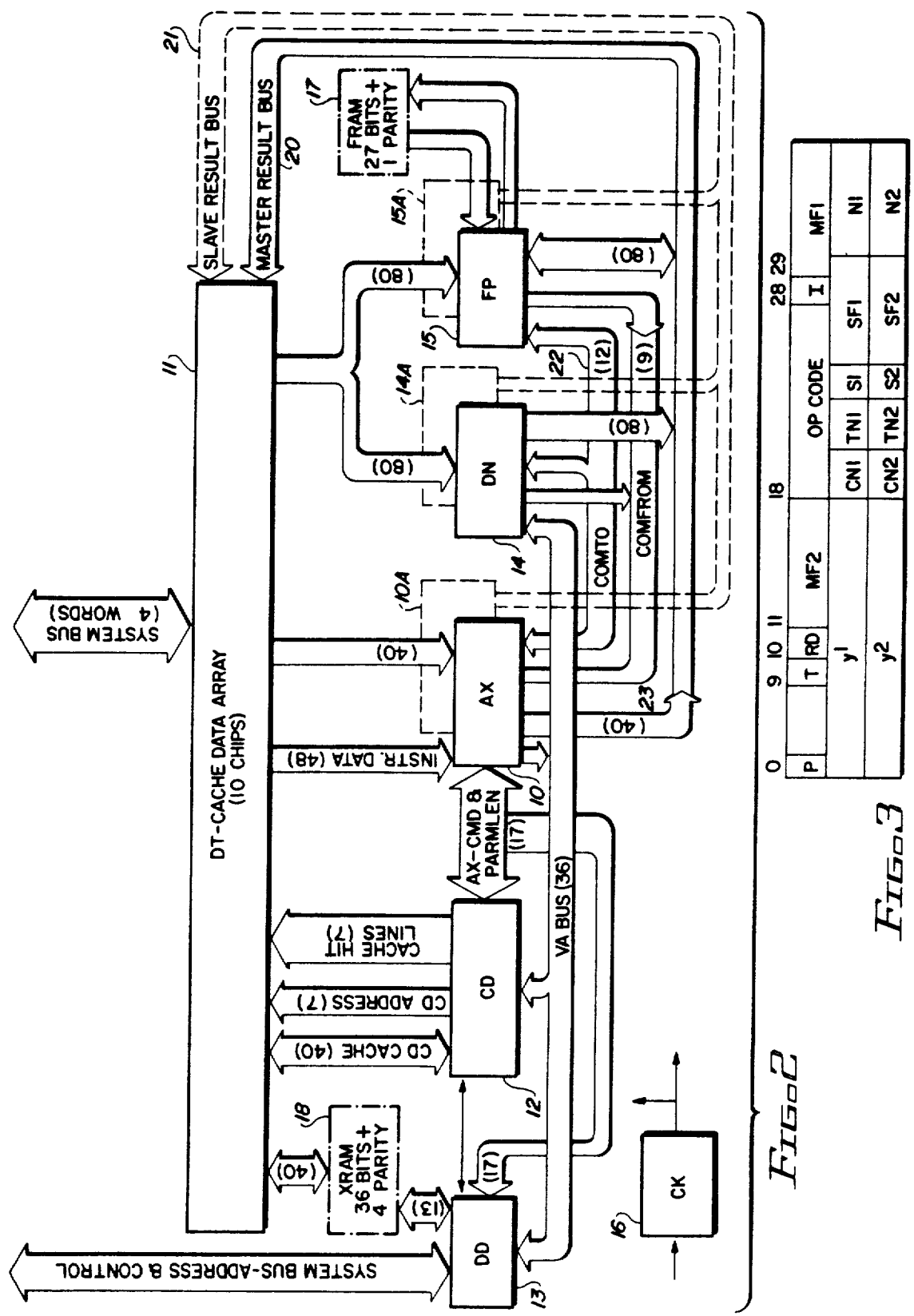

BINARY TO BINARY CODED DECIMAL AND BINARY CODED DECIMAL TO BINARY CONVERSION IN A VLSI CENTRAL PROCESSING UNIT

This is a continuation of copending application Ser. No. 07/541,229 filed on Jun. 20, 1990.

FIELD OF THE INVENTION

This invention relates to information processing systems and, more particularly, to BCD-to-Binary and Binary-to-BCD conversion processes performed in a Very Large Scale Integrated (VLSI) central processing unit.

BACKGROUND OF THE INVENTION

Information is stored and manipulated in data processing systems in several binary forms. Among the most common are straight binary (a series of ones and zeros representing, at each digit, whether or not the power of two at that position is a constituent of the represented number) and Binary-Coded-Decimal BCD (one or more groups of four binary digits, each group representing a decimal digit, the legal groups thus extending from 0000 representing $0_{10}$ to 1001 representing $9_{10}$). It is often necessary to convert between binary and BCD in preparation for conducting various operations or in concluding an operation, and numerous algorithms and procedures for effecting the conversions per se are well known in the art.

As central processing units of information processing systems have increased in power and speed, it has been necessary and useful to correspondingly increase their level of integration (and hence dramatically reduce their size), and virtually entire central processing units have been implemented on a single VLSI chip. However, the most powerful mainframe central processing units, because of their complexity, typically employ several VLSI chips which may be situated on a single printed circuit board.

As previously noted, instructions for effecting conversion between binary and BCD numbers has been a feature of mainframe computers for many years, and it might be thought that an effective implementation of such conversion features in an earlier, central processing unit employing less dense integration might simply be copied to a VLSI central processing unit. It has been found, however, that such is not necessarily the case because, in a single printed circuit board central processing unit, the division of the computing burden among the several VLSI chips will often not correspond with the distribution of the computing burden among the several logic blocks of an earlier, less densely integrated central processing unit. Therefore, it may become necessary to redevelop and transmute even such apparently straightforward computing operations as data conversion in order to implement these operations into single printed wiring board central processing units, and it is to the realization of these conversion operations in the VLSI environment that the present invention is directed.

OBJECTS OF THE INVENTION

It is therefore a broad object of this invention to provide improved processes for performing data conversion between BCD and binary data formats.

It is a more specific object of this invention to provides such improved data conversion processes which are particularly well adapted for application within a VLSI central processing unit.

It is a still more specific object to provides such improved data conversion processes in a central processing unit employing a plurality of VLSI chips in which the computing burden is distributed in an innovative manner.

SUMMARY OF THE INVENTION

Briefly, these and other objects of the invention are achieved by interaction among an address and execution (AX) VLSI chip, a decimal numeric (DN) VLSI chip and a memory (typically a cache memory) in performing Binary-Coded-Decimal to binary (DTB) and binary to Binary-Coded-Decimal (BTD) extended instruction set (EIS) type instructions.

For the DTB instruction, in response to control signals provided by the AX chip, the DN chip will receive the Binary-Coded-Decimal (BCD) operand to be converted from the cache unit. The DN chip strips off and saves the sign and loads the operand into a DN conversion register, right justified. When a converted bit is generated, a Ready-to-Send command is sent on a COMFROM bus which couples the AX and DN chips. Overlap with a Ready-to-Receive command placed on a COMTO bus (which also couples the AX and DN chips), causes the AX chip to accept the bit and the DN chip to generate the next bit. Thus, a conversion rate of one bit per clock cycle can be maintained. If the operand is negative, the DN chip will invert each remaining bit after the first "1" has been sent to obtain a two's-complement result, or a result in two's-complement notation. Bits are sent to the AX chip from least significant to most significant, and the last bit sent is marked as such which allows the DN chip to terminate and the AX chip to complete the instruction. The converted result is sent to the cache unit from the AX chip via a result bus.

For the BTD instruction, the AX chip receives the operand to be converted from the cache unit and sends one bit at a time to the DN chip (beginning with the most significant bit which is the sign) on the COMTO bus along with the Ready-to-Send command. When the DN chip signals Ready-to-Receive on the COMFROM bus, the bit will be sent to the DN chip and entered into the conversion process, and the next bit will be placed on the COMTO bus by the AX chip. If the sign of the operand being converted is negative, all incoming bits will be inverted by the DN chip. A one's complement numeric result is thus generated, and this number will be passed through the DN chip's decimal adder where one will be added to produce a true two's-complement number. The last bit sent by the AX chip will also be marked as such so that the DN chip can terminate the conversion. The converted result is sent to the cache unit from the DN chip via the result bus.

DESCRIPTION OF THE DRAWING

The subject matter of the invention is particularly pointed out and distinctly claimed in the concluding portion of the specification. The invention, however, both as to organization and method of operation, may best be understood by reference to the following description taken in conjunction with the subjoined claims and the accompanying drawing of which:

FIG. 2 is a general block diagram of the central processing unit of the central system structure of FIG. 1, in which central processing unit the subject invention is employed;

FIG. 3 illustrates the format of the Extended Instruction Set (EIS) class of instructions which includes the conversion instructions of the subject invention;

DETAILED DESCRIPTION OF THE INVENTION

Figure 1:
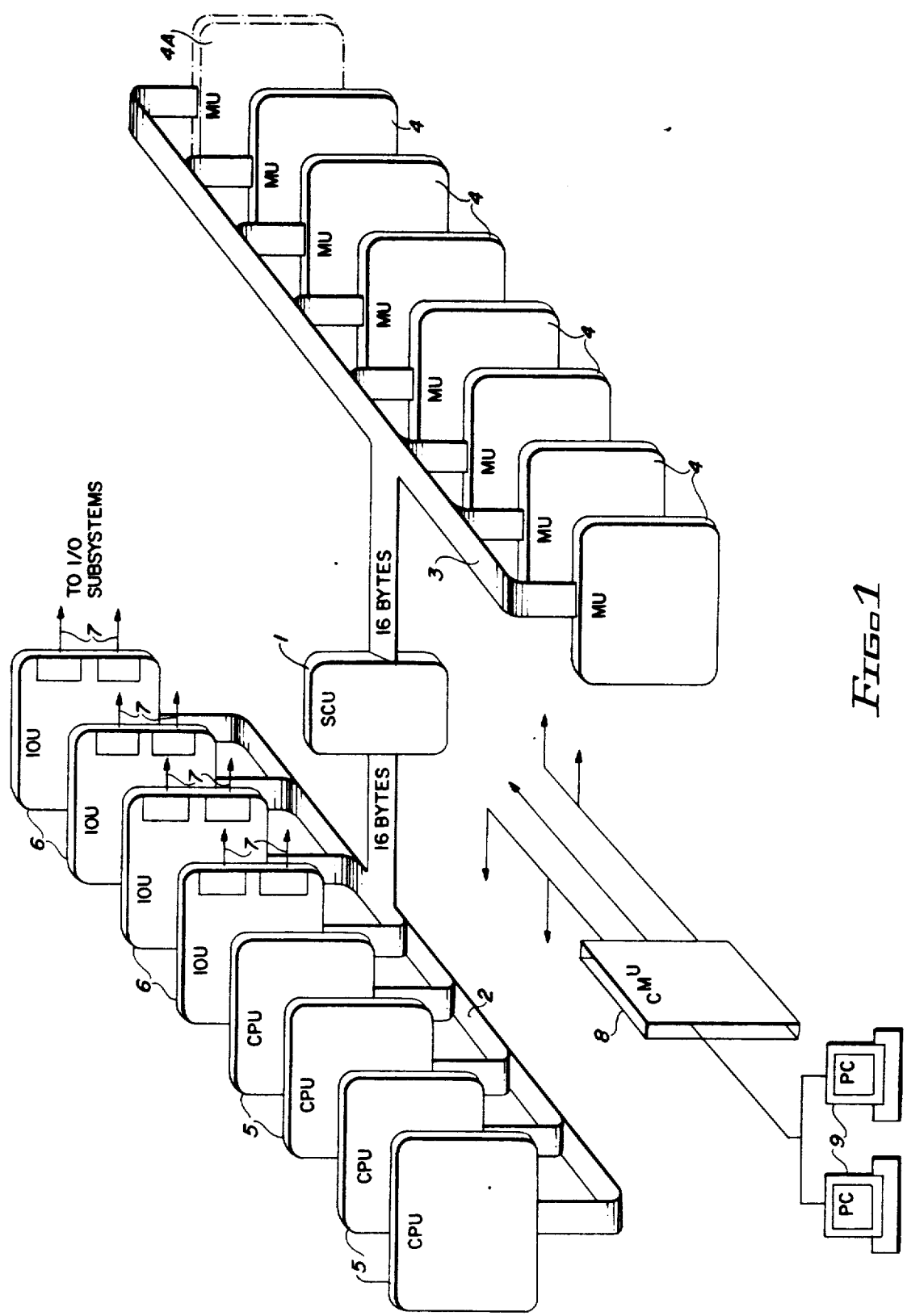
FIG. 1 is a very high level block diagram of the central system structure of an information processing system in which the subject invention finds application.

Attention is first directed to FIG. 1 which illustrates an exemplary Central Subsystem Structure (CSS) within which the subject invention may be incorporated. The System Control Unit (SCU) 1 centralizes and controls the system bus 2 and the memory bus 3 scheduling. More particularly, the SCU 1: A) performs memory control, single bit error correction and double bit error detection; B) controls the memory configuration of which there are one per Memory Unit (MU) 4; C) manages 64-byte block transfers between the Central Processing Units (CPUs) 5 and the MUs in conjunction with the store-into-cache feature of the CPUs; D) corrects single bit errors found in modified blocks of a CPU's cache or on a data transfer from a CPU, MU or Input/Output Unit (IOU) 6; and E) contains the system calender clock.

The system bus 2 interconnects 1 to 4 CPUs and 1 to 4 IOUs with each other and with the SCU. The system bus includes a 16-byte bidirectional data interface, a bidirectional address and command interface, an SCU status interface monitored by all CPUs and IOUs, and a small number of control lines between the SCU and each individual CPU and IOU. Data is exchanged on the system bus in 16, 32 or 64-byte groups, and data exchanges can be between a CPU and an MU, an IOU and an MU, two CPUs and a CPU and an IOU. The operations through the system bus 2 are:
Read 16, 32 or 64 bytes;
Read with exclusivity: 64 bytes;
Write from IOU: 16, 32 or 64 bytes;
Write from CPU (swapping): 64 bytes;
Interrupts and Connects;- Read/Write registers.

Every system bus operation consists of an address phase and a data phase, and an address phase can start every two machine cycles. Consecutive 16-byte data transfers within a group can occur on consecutive machine cycles. An IOU or CPU can wait for the data phase of up to two requests at the same time. The data blocks are transferred in the same order as the requests are received.

The memory bus 3 interconnects 1 to 8 MUs with the SCU. The memory bus includes a 16-byte bidirectional data interface, an address and command interface from the SCU to all MUs and a small number of control lines between the SCU and each individual MU. Data is exchanged on the memory bus in 16, 32 or 64-byte groups. The operations through the memory bus 3 are:
Read: 16, 32 or 64 bytes;
Write: 16, 32 or 64 bytes.

The main memory is composed of up to eight MUs. (A ninth slot, MU 4A, may be provided for ease of reconfiguration and repair in case of failure.) A single bit correction, double bit detection code is stored with every double word; i.e., 8 code bits for every 72 data bits. The code is arranged so that a 4-bit error within a single chip is corrected as four single bit errors in four different words. Data in an MU is addressed from the SCU in 16 byte (four word) increments. All bytes within any one MU are consecutively addressed; i.e., there is no interlace between MUs which operate in parallel. A memory cycle may start every machine cycle, and a memory cycle, as seen from a CPU, is ten machine cycles, assuming no conflicts with other units. An MU 4 contains 160 Dynamic Random Access Memory (DRAM) circuits, each of which has n by 4 bit storage elements where n=256, 1024 or 4096.

The IOUs 6 each provide a connection between the system bus 2 and two Input/Output Buses (IOBs) 7 such that each IOB interfaces with a single IOU. Thus, an IOU manages data transfers between the CSS and the I/O subsystems, not shown in FIG. 1.

A Clock and Maintenance Unit (CMU) 8 generates, distributes and tunes the clock signals for all the units in the CSS, provides the interface between the service processor(s) (SP) 9 and the central processing, input-/output and power subsystems, initializes the units of the CSS and processes errors detected within the CSS units. The CSS employs a two-phase clock system and latched register elements in which the trailing edge of clock 1 defines the end of phase 1, and the trailing edge of clock 2 defines the end of phase two, each phase thus being one-half of a machine cycle.

The SP(s) 9 may be a commodity personal computer with an integrated modem for facilitating remote maintenance and operations, and large systems may include two SPs through which the system can be dynamically reconfigured for high availability. The SP performs four major functions:
monitor and control of the CSS during initialization, error logging or diagnostic operations;
serves as the primary operating system console during system boot or on operator command;
serves as console and data server for the input/output subsystems Maintenance Channel Adaptor (MCA);
provides a remote maintenance interface.

Attention is now directed to FIG. 2 which is a general block diagram of one of the CPUs 5 of FIG. 1. The Address and Execution Unit (AX unit) is a microprocessing engine which performs all address preparation and executes all instructions except decimal arithmetic, binary floating point and multiply/divide instructions. Two identical AX chips 10, 10A perform duplicate actions in parallel, and the resulting AX chip outputs are constantly compared to detect errors. The structure of the AX chip will be described in more detail below. The main functions performed by the AX unit include:
effective and virtual address formation;
memory access control;
security checks;
register change/use control;
execution or basic instructions, shift instructions, security instructions, character manipulation and miscellaneous instructions.

The cache unit includes a data part of 64K bytes (16K words) and a set associative directory part which defines the main memory location of each 64-byte (16-word) block stored in the cache data part. Physically, the cache unit is implemented in an array of ten data DT chips 11, a cache directory (CD) chip 12 and a duplicate directory (DD) chip 13. Each of the DT, CD and DD chips will be described in more detail below.

The specific functions performed by the DT chip array 11 include:
combined instruction and operand data storage;
instruction and operand buffering and alignment;
data interface with the system bus 2 (FIG. 1);
CLIMB safestore file.

The cache write strategy is "store into". If a longitudinal parity error is detected when reading a portion of a modified block from the cache, the block will be swapped out of the cache, corrected by the SCU and written into main memory. The corrected block will then be refetched from main memory.

Two copies of the cache directory information are respectively maintained in the CD and DD chips which perform different logic functions. The two directory copies allow interrogation of the cache contents from the system bus in parallel and without interference with instruction/operand access from the CPUs and also provide for error recovery. Functions performed by the CD chip 12 include:
cache directory for CPU accesses;
instruction, operand and store buffer management;
virtual-to-real address translation paging buffer.

Functions performed by the DD chip 13 include:
cache directory for system accesses;
system bus control;
distributed connect/interrupt management;
cache directory error recovery.

Efficient scientific calculation capability is implemented on the Floating Point (FP) chips 15, 15A. The identical FP chips execute all binary floating point arithmetic in duplicate. These chips, operating in concert with the duplicate AX chips 10, 10A, perform scalar or vector scientific processing.

The FP chip 15 (duplicated by the FP chip 15A):
executes all binary and fixed and floating point multiply and divide operations;
computes 12 by 72-bit partial products in one machine cycle;
computes eight quotient bits per divide cycle;
performs modulo 15 residue integrity checks.

Functions performed by the FP chips 15, 15A include:
executes all floating point mantissa arithmetic except multiply and divide;
executes all exponent operations in either binary or hexadecimal format;
preprocesses operands and postprocesses results for multiply and divide instructions;
provides indicator and status control.

Two special purpose random access memories (FRAM 17 and XRAM 18) are incorporated into the CPU. The FRAM chip 17 is an adjunct to the FP chips 15, 15A and functions as an FP control store and decimal integer table lookup. The XRAM chip 18 is an adjunct to the AX chips 10, 10A and serves as a scratchpad as well as providing safestore and patch functions.

The CPU also employs a Clock Distribution (CK) chip 16 whose functions include:
clock distribution to the several chips constituting the CPU;
shift path control;
maintenance;
interface between CMU and CPU;
provision of clock stop logic for error detection and recovery.

The DN chip 14 (in parallel with the DN chip 14A) performs the execution of the decimal numeric Extended Instruction Set (EIS) instructions. It also executes the Decimal-to-Binary (DTB), Binary-to-Decimal (BTD) conversion EIS instructions and Move-Numeric-Edit (MVNE) EIS instructions in conjunction with the AX chip 10. The DN chip both receives operands from memory and sends results to memory via the cache unit 11.

It was previously noted that the AX, DN and FP chips were duplicated with the duplicate units operating in parallel to obtain duplicate results which are available for integrity checking. (The unit pairs are respectively named the AX unit, the DN unit and the FP unit for convenience.) Thus, master and slave results are obtained in the normal operation of these chips. The master results are placed onto a Master Result Bus (MRB) 20 while the slave results are placed onto a Slave Result Bus (SRB) 21. Both the master and slave results are conveyed, on the MRB and SRB respectively, to the cache data array 11 of DT chips. The purposes of this arrangement will be described more fully below. In addition, a COMTO bus 22 and a COMFROM bus 23 couple together the AX unit, the DN unit and the FP unit for certain interrelated operations as will also be described more fully below.

With respect to the cooperation of the AX chip 11 and the DN chip 14 in performing certain operations, it is useful to have an understanding of the format of the EIS instructions, and this format is illustrated in FIG. 3. There are twenty-four instructions in this class, and each consists of an instruction word and one or two descriptor words. The EIS instructions are:

| ADD | AD2D | AD2DX | AD3D | AD3DX |
| SUBTRACT | SB2D | SB2DX | SB3D | SB3DX |
| MULTIPLY | MP2D | MP2DX | MP3D | MP3DX |
| DIVIDE | DV2D | DV2DX | DV3D | DV3DX |
| MOVE | MVN | MVNX | | |
| COMPARE | CMPN | CMPNX | | |
| CONVERT | DTB | BTD | | |
| EDIT | MVNE | MVNEX | | |

In FIG. 3:

P — Alternate + Sign Output
T — Truncation Fault Enable
RD — Round Results
CN — Starting Character or Digit Number
TN — Data type (i.e., 4- or (9bit)
S — Sign Type
SF — Scale Factor
N — Length The special features of the EIS instructions are as follows:

1. The numeric operand can be from 1 to 63 digits long including sign and exponent (if present);
2. Data can be packed decimal or unpacked ASCII and can be intermixed between operands;
3. Binary data for the conversion instructions can be from 1 t 8 bytes long;

4. The normal sign types are leading sign, trailing sign, no sign and floating point (leading sign with trailing exponent);
5. Overpunched signs can occur for unpacked operands for the extended sign type instructions.
6. Packed data (4-bit) can start at any of eight digit positions within a word; unpacked data can start at one of four character positions;
7. Each numeric operand can be either scaled or floating point; floating point results will preserve the most significant digits to prevent overflow.

Thus, the AX chip control signals, sends to the DN chip an execution code and up to three words of parameters corresponding to the descriptors of an EIS instruction to be executed. Pointers, shift counts and masks are generated to control the processing of operands received by the DN chip from the cache unit and for the execution of the instruction. Results are sent back to the cache unit on the MRB (and SRB), and indicators and faults are sent to the AX chip on the COMFROM bus.

Four EIS instructions (DTB, BTD, MVNE and MVNEX) are special in that they have only one numeric operand and they are executed in conjunction with the AX chip. Because of this, they have a different descriptor transfer, operand sequence and control/data transmittal between chips. The present invention relates to the DTB and BTD instructions.

For the DTB instruction, the DN chip will receive only operand one containing the Binary-Coded-Decimal (BCD) number to be converted from the cache unit. The DN chip strips off and saves the sign and loads the operand into its conversion register, right justified. When a converted bit is generated, the Ready-to-Send command is sent on the COMFROM bus. Overlap with the COMTO command, Ready-to-Receive, causes the AX chip to accept the bit and the DN chip to generate the next bit. Thus, a conversion rate of one bit per clock cycle can be maintained. If the operand is negative, the DN chip will invert each remaining bit after the first "1" has been sent to obtain a two's-complement result, or a result in two's-complement notation. Bits are sent to the AX chip from least significant to most significant, and the last bit sent is marked as such which allows the DN chip to terminate and the AX chip to complete the instruction. The converted result is sent to the cache unit from the AX chip via the result bus.

For the BTD instruction, the AX chip receives operand one to be converted from the cache unit and sends one bit at a time to the DN chip (beginning with the most significant ( bit which is the sign) on the COMTO bus along with the Ready-to-Send command. For each succeeding bit, when the DN chip signals Ready-to-Receive on the COMFROM bus, the bit will be entered into the conversion process, and the next bit will be placed on the COMTO bus by the AX chip. The bit-by-bit output from the conversion process is placed in the DN conversion register. If the sign of the operand being converted is negative, all incoming bits will be inverted by the DN chip because, in this embodiment, the conversion algorithm works only on positive numbers. A ones-complement numeric result is thus generated, and this number will be passed through the DN chip's decimal adder where one will be added to produce a true two's-complement number. The last bit sent by the AX chip will also be marked as such so that the DN chip can terminate the conversion. The converted result is sent to the cache unit from the DN chip via the result bus.

Figure 4:
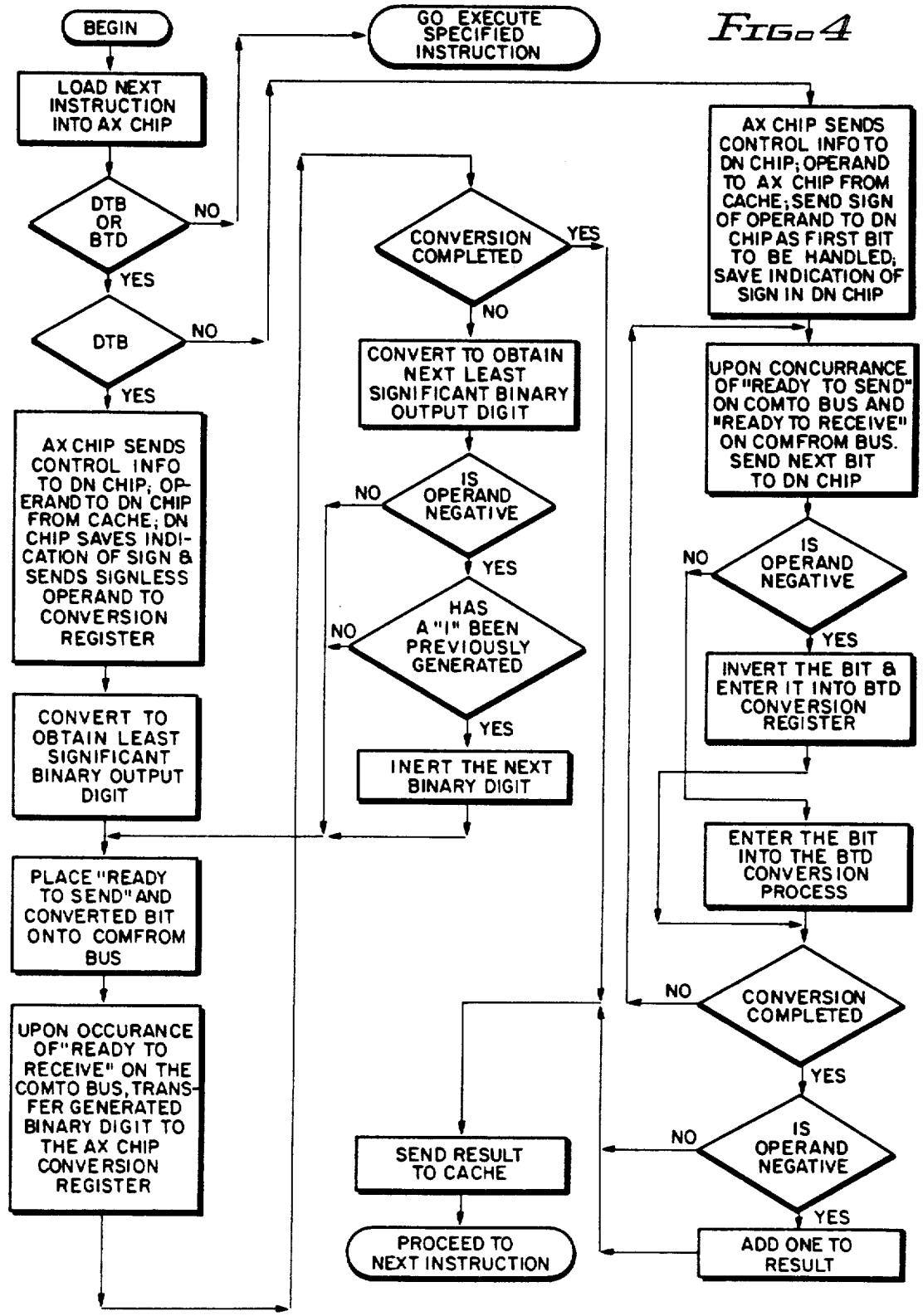
FIG. 4 is a process flow chart of the steps undertaken in performing the data conversion processes of the subject invention.
Figure 5:
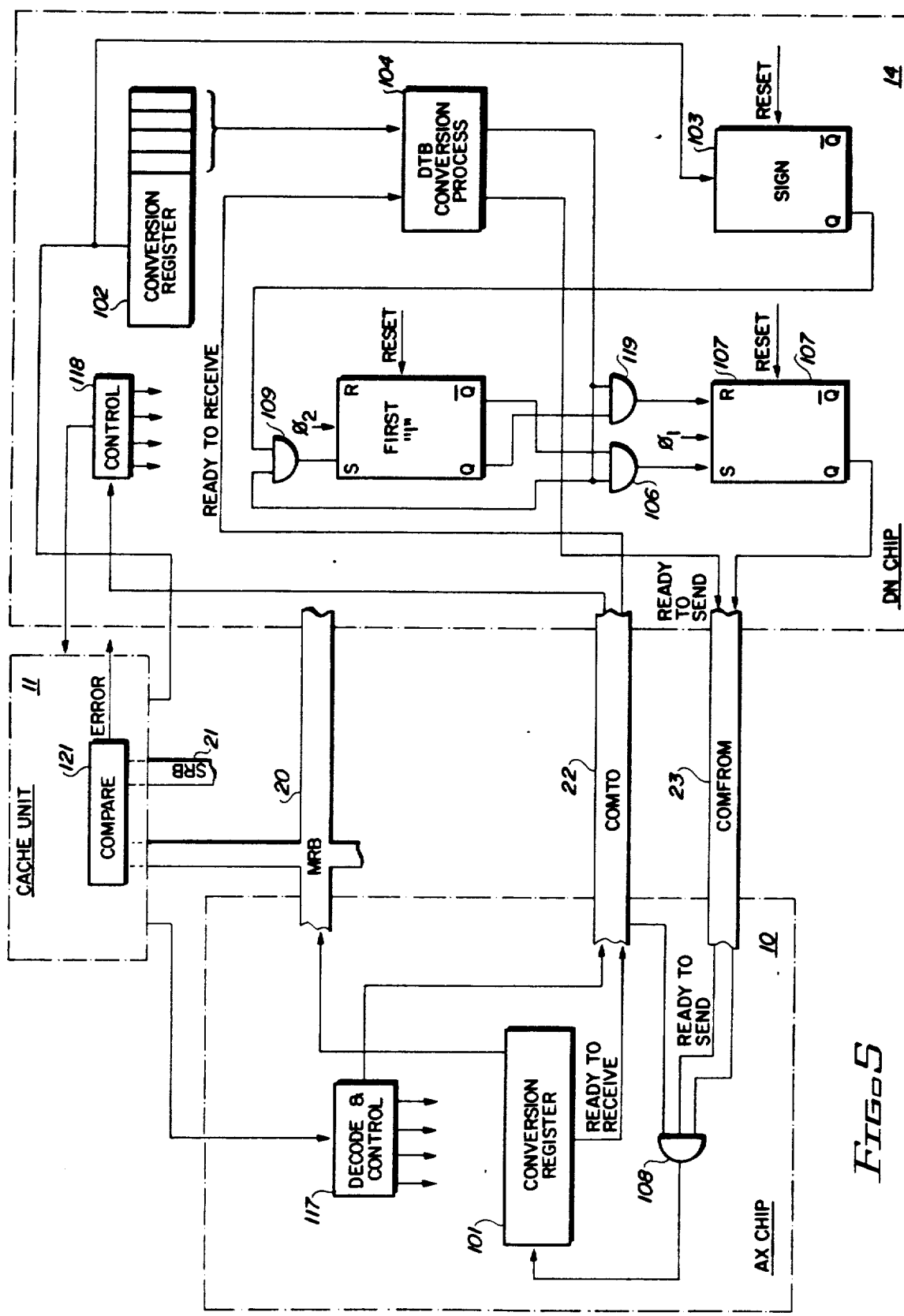
FIG. 5 is a logic diagram representation of exemplary apparatus for performing a BCD-to-Binary data conversion according to the subject invention.

FIG. 4 is a flow chart of the subject conversion processes as implemented in the exemplary environment while FIG. 5 is a simplified logical representation of the subject DTB conversion technology which is presented to clarify the fundamental concepts thereof. While the representation of structure shown in FIG. 5 (and the similar structure shown in FIG. 6 for the BTD instruction) may be used to construct actual circuitry, it will be understood that both the AX chip 10 and the DN chip 14 are, in the exemplary embodiment, actually implemented in microprogrammed and/or hardwired VLSI technology. Those skilled in the art will appreciate that pictorial and logical representations of VLSI circuitry are very difficult to comprehend unless the peruser is intimately familiar with the actual VLSI circuitry under study and, if used, its mioroprogramming; hence the necessity for the use of conceptual, functionally equivalent, logic diagrams to set forth the invention.

Referring particularly to FIG. 5 while also tracking the appropriate path through the process flow chart of FIG. 4, it will be understood initially that an AX conversion register 101 on the AX chip 10 is prepared to receive a binary word to be converted by the DN chip 14 which has already received the BCD operand from the cache unit and the necessary control information from the AX chip. That is, the appropriate components of the BTD EIS instruction have been received from the cache unit 11 by the decode and control block 117 of the AX chip, and the block 117 has issued control signals to the control block 118 of the DN chip which, in turn, has called the operand to be converted from the cache unit. The operand is stored in the DN conversion register 102, and the sign has been stripped off and saved in the flipflop 103. Since the operand is in BCD form, the DTB Conversion Process block 104 (which can employ any conventional BCD-to-Binary algorithm) first examines the last four binary digits held in the register 102 since the converted bits are transferred least-significant to most-significant.

In the following discussion, it will be noted that there are two clock phases, $\Phi 1$ and $\Phi 2$, which occur alternately without overlap. These clock pulses are routinely supplied by the CK chip 16 shown in FIG. 2.

Consider first the conversion of a positive BCD number. The sign flipflop 103 and a "first 1 detector" flipflop 105 will both have routinely been reset before conversion starts. When the least significant converted bit is issued by the conversion block 104, it is applied to one input of an AND-gate 106 which has its other leg driven by the Q-bar output of the flipflop 105. As a result, an output flipflop 107, at $\Phi 1$, either sets or leaves reset the flipflop 107 depending upon whether the converted bit is a "1" or &37 0", and the Q output of flipflop 107 is applied to the COMFROM bus 23 along with the "Ready-to-Send" signal from the conversion block 104.

If the register 101 is prepared to receive the converted bit, the "Ready-to-Receive" signal is placed on the COMTO bus 22 and also partially enables an AND-gate 108 which is also driven by the "Ready-to-Send" signal and the output from the flipflop 107 via the COMFROM bus 23. Thus, if the converted bit is a "1", a "1&38 is clocked into the least significant bit position of the register 101 of the AX chip during the overlap of "Ready-to-Send" and "Ready-to-Receive"; similarly, if the converted bit is a "0", it is entered into the register 101. The "Ready-to-Receive" signal is also conveyed to the conversion block 104 to request conversion of the next binary digit. This process continues digit-by-digit until the conversion is completed whereupon the result is placed on the MRB 20 for transfer to the cache unit 11.

In the conversion of a negative BCD operand, it is desirable to obtain a two's complement binary representation of the converted word since this form is compatible with positive binary words in performing basic arithmetic operations. The subject conversion process obtains two's complement binary representation of a negative number automatically. Assume that the operand held for conversion in the register 102 is negative and that that fact has caused sign flipflop 103 to be set. Thus, its Q output partially enables an AND-gate 109 which is also driven by the converted bits from the conversion block 104. AND-gate 109 drives the set input to "first 1 detector" flipflop 105 which is clocked by Φ2.

Now, beginning with the least significant converted binary digit, so long as the current binary digit is a "0", the process will continue just as described above for a positive operand. But, consider the operation when the first "1" binary digit is generated by the conversion block 104. That first "1" binary digit will be passed along to the COMFROM bus 23 as previously described since the output flipflop 107 is clocked by Φ1. But, at the immediately following Φ2, the flipflop 105 will be set since AND-gate 109 is fully enabled. As a result, AND-gate 106 is disabled, and AND-gate 119 becomes partially enabled to transfer the bit stream from the conversion block 104 to the reset input of output flipflop 107. Thus, it will be seen that, after the first converted "1" issued by the conversion block 104 has been delivered to the register 101, all subsequent binary digits will be inverted before delivery to the register 101. This procedure achieves a true two's complement result without the need for a subsequent "add one" operation as is typical of most conversion processes.

Figure 6:
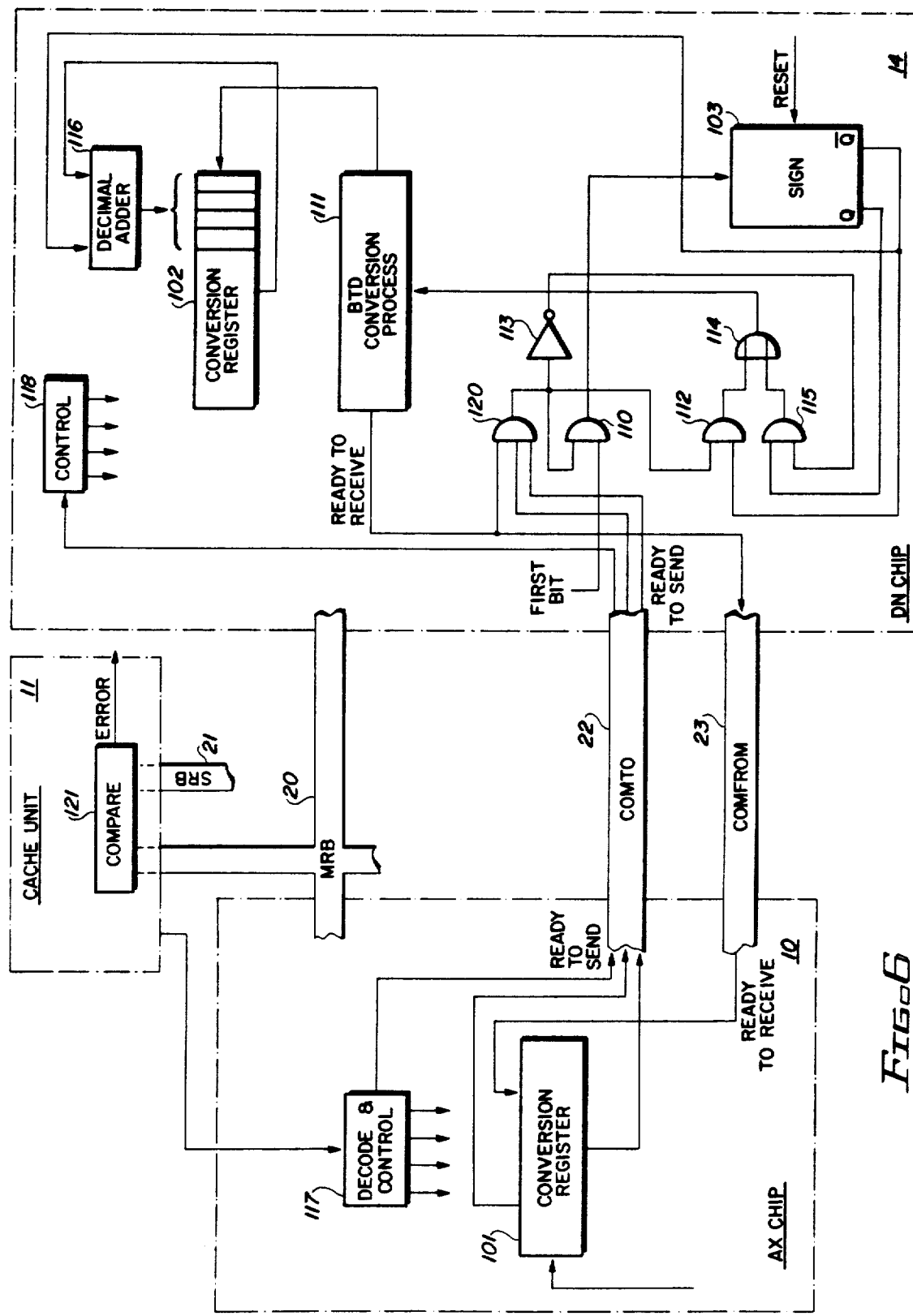
FIG. 6 is a logic diagram representation of exemplary apparatus for performing a Binary-to-BCD data conversion according to the subject invention.

BTD (i.e., Binary-to-BCD) conversion also involves cooperation between the AX and DN chips. Referring now to FIG. 6 while also tracking the appropriate path through the process flow chart of FIG. 4, it will be understood that register 101 on the AX chip 10 has already received from the cache unit 11 a binary operand to be converted and that the DN chip has already received the necessary control information from the AX chip and is prepared to receive the operand, bit by bit, into the conversion process 111. That is, the appropriate components of the BTD EIS instruction have been received from the cache unit 11 by the decode and control block 117 of the AX chip, and the block 117 has issued control signals to the control block 118 of the DN chip.

The conversion process commences with the transfer (upon the concurrence of Ready-to-Send on the COMTO bus and Ready-to-Receive on the COMFROM bus) with the transfer of the most significant bit which is guided by an AND-gate 110 to set the flipflop 103 only if the operand is negative. In the DN chip, for subsequent bits transferred from the AX chip to the DN chip for conversion, each bit is applied to an input to an AND-gate 120 which also is driven by the Ready-to-Receive and Ready-to-Send signals. The output from AND-gate 120 is applied to one input of AND-gate 112 and also to the input to an inverter 113. Assuming a positive operand, the AND-gate 112 is already partially enabled by the Q bar output from sign flipflop 110 and thus will, during the concurrence of the Ready-to-Receive and Ready-to-Send signals, pass the current bit issued by the AX chip to OR-gate 114 which directs the bit into the conversion BTD process block 111 whose output is, in turn, sent to the conversion register 102. The "Ready-to-Receive" signal also requests that the register 101 in the AX chip send the next bit. This process is repeated bit by bit until the conversion is completed and the new BCD word resides in the conversion register 102.

If the binary operand to be converted is negative, additional operations must be undertaken. Since the sign flipflop 103 will be set, the AND-gate 112 will be disabled, and the AND-gate 115 will be partially enabled by the Q output of the flipflop 103 to drive the OR-gate 114 with the inverted bit stream from inverter 113. Consequently, a one's complement result will have been passed through the BTD conversion process block 111. Thus, it is necessary to subsequently circulate the converted number through the decimal adder 116 to add one in order to obtain the desired two's complement form, and this step is undertaken if the sign flipflop 103 is set. The final result, whether positive or negative, is then sent to the cache unit on the MRB 20.

As previously discussed, it will be understood that the AX chip 10A and DN chip 14A (FIG. 2) will have performed an identical BTD or DTB conversion in parallel with the AX chip 10 and DN chip 14 and will have placed the result on the SRB 21 (FIGS. 2, 5, 6). The cache unit 11 includes compare block 121 which examines the master and slave results and issues an error signal if they are not identical. The error signal may then be employed by the error detection and recovery features and processes of a given system in accordance with such features. For example, a retry may be in order. If the same or a related error occurs repeatedly, a shut down of an entire CPU may be required. In short, the response to a sensed no-compare error will be that which has been designed into the given system.

Those skilled in the art will appreciate that, as the limits of integration are pushed, an entire CPU employing the features of the present invention may be soon realized, and the fact that the described embodiment is implemented among several VLSI chips is not intended to be a limitation on the invention.

Thus, while the principles of the invention have now been made clear in an illustrative embodiment, there will be immediately obvious to those skilled in the art many modifications of structure, arrangements, proportions, the elements, materials, and components, used in the practice of the invention which are particularly adapted for specific environments and operating requirements without departing from those principles.

What is claimed is:

1. A central processing unit (CPU) comprising:
   a decimal numeric (DN) unit for executing decimal numeric instructions;
   a floating point (FP) unit for executing floating point instructions;
   a cache unit for storing instructions and operands consisting of a plurality of bits in addressable locations;
   a clock unit for producing clock pulses for the units of the CPU; and
   an address and execution (AX) unit including means for producing addresses, and control signals required by the units of CPU to execute an instruction, each of said DN, FP, and AX units being implemented on a single very large scale integrated (VLSI) chip;

bus means interconnecting the units of the CPU for transmitting signals representing instructions, operands, clock pulses, and control signals between said units;

said AX unit including means for fetching an instruction from the cache unit, means for decoding said instruction, hereafter the instruction in execution, to produce control signals to control operation of the units of the CPU in executing the instruction in execution, said AX unit further including means for transmitting over the bus means control signals required by the units of the CPU to execute the instruction in execution, and AX conversion register means for temporarily storing the bits of an operand;

said DN unit including means for storing control signals received from the AX unit over the bus means, DN conversion register means for temporarily storing the bits of an operand, and binary coded decimal to binary conversion means for converting a given binary coded decimal operand stored in said DN conversion register means of the DN unit to a resultant binary operand at the rate of one bit per clock pulse, both the given and the resultant operands having the same numeric value;

the means for decoding an instruction of the AX unit in response to the receipt of an instruction to convert a binary coded decimal operand to a resultant binary operand, producing control signals to cause the DN unit to fetch the given binary coded decimal operand from the cache unit and to store said given operand in the DN conversion register means, control signals produced by the AX unit causing the DN unit to apply the bits of said given operand at the rate of one bit per clock bit to the DN unit's binary coded decimal to binary conversion means for converting the bits of the given operand to the bits of the resultant operand;

control signals exchanged between the DN and AX units causing the bits of said resultant operand to be stored in the AX conversion register at the rate of one bit per clock pulse;

said AX unit producing control signals which cause the AX unit to transmit the resultant operand from the AX conversion register means to the cache unit for storage in the cache unit.

2. A central processing unit as set forth in claim 1 in which the DN unit includes circuit means for converting a given negative binary coded decimal given operand to a resultant operand in two's complement notation prior to transmitting the bits of the resultant operand to the AX unit.

3. A central processing unit (CP) comprising:

a decimal numeric (DN) unit for executing decimal numeric instructions;

a floating point (FP) unit for executing floating point decimal numeric instructions;

a cache unit for storing instructions and operands consisting of a plurality of bits in addressable locations;

a clock unit for applying clock pulses to the units of the CPU; and an address and execution (AX) unit including means for producing addresses, and control signals required by the units of CPU to execute an instruction; each of said DN, FP, and AX units being implemented on a single very large scale integrated (VLSI) chip;

bus means interconnecting the units of the CPU for transmitting signals representing instructions, operands, clock pulses, and control signals between said units;

said AX unit including means for fetching an instruction from the cache unit, means for decoding said instruction, hereafter an instruction in execution, to produce control signals to control operation of the units of the CPU in executing the instruction in execution, said AX unit further including means for transmitting over the bus means control signals required by the units of the CPU to execute the instruction in execution, and an AX conversion register means for temporarily storing bits of an operand;

said DN unit including means for storing control signals received from the AX unit over the bus means, DN conversion register means for temporarily storing the bits of an operand, and binary to binary coded decimal conversion means for converting a given binary operand stored in the AX conversion register means to a resultant binary coded decimal operand at the rate of one bit per clock pulse, both the given and the resultant operands having the same numeric value;

the means for decoding an instruction of the AX unit in response to the receipt of an instruction to convert a given binary operand to a resultant binary coded decimal operand producing control signals to cause the AX unit to fetch the bits of the given binary operand from the cache unit and to store the bits of said given operand in the AX conversion register means, and control signals to cause the AX unit to apply the bits of said given operand stored in the AX unit's conversion register means to DN unit's binary to binary coded decimal conversion means;

the DN unit in response to control signals received from the AX unit to transmit to the DN unit bits of the given operand stored in the AX unit's conversion register means beginning with the most significant bit and at the rate of one bit per clock period, the bits of the given operand received by the DN unit from the AX unit being applied to the SN unit's binary to binary coded decimal conversion means for converting the given binary operand to a resultant binary coded decimal operand at the rate of one bit per clock period and storing the bits of the resultant operand in DN conversion register means, and transmitting the resultant operand from the DN conversion register means to the cache unit for storage in the cache unit.

4. A central processing unit as set forth in claim 3 in which the DN unit includes circuit means for converting a given negative binary operand to a resultant operand in two's complement notation prior to the bits of the resultant operand being stored in the conversion register means of the DN unit.

* * * * *